United States Patent
Koronel et al.

(10) Patent No.: US 9,711,327 B2
(45) Date of Patent: Jul. 18, 2017

(54) METHOD AND SYSTEM FOR OPTIMIZING CONFIGURABLE PARAMETERS OF INSPECTION TOOLS

(71) Applicant: Applied Materials Israel Ltd., Rehovot (IL)

(72) Inventors: Dan Koronel, Tel Aviv (IL); Amir Wilde, Rehovot (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 14/801,600

(22) Filed: Jul. 16, 2015

(65) Prior Publication Data

US 2017/0018403 A1    Jan. 19, 2017

(51) Int. Cl.
| | |
|---|---|
| *G01N 23/00* | (2006.01) |
| *H01J 37/26* | (2006.01) |
| *H01J 37/22* | (2006.01) |
| *H01J 37/244* | (2006.01) |

(52) U.S. Cl.
CPC .......... *H01J 37/265* (2013.01); *H01J 37/222* (2013.01); *H01J 37/244* (2013.01); *H01J 2237/28* (2013.01)

(58) Field of Classification Search
CPC .......... H01J 37/00; H01J 37/02; H01J 37/304; H01J 37/3045; H01J 37/222; H01J 37/24; H01J 37/244

USPC .......... 250/306, 307, 311
See application file for complete search history.

(56) References Cited

U.S. PATENT DOCUMENTS

| | | | |
|---|---|---|---|
| 2001/0033683 A1* | 10/2001 | Tanaka | G06T 7/001 |
| | | | 382/149 |
| 2002/0130262 A1* | 9/2002 | Nakasuji | G01N 23/225 |
| | | | 250/311 |
| 2009/0072139 A1* | 3/2009 | Nagahama | H01J 37/28 |
| | | | 250/310 |
| 2009/0208091 A1* | 8/2009 | Hayakawa | G01N 21/956 |
| | | | 382/149 |
| 2011/0001816 A1* | 1/2011 | Yonekura | G01B 15/04 |
| | | | 348/80 |
| 2014/0050389 A1 | 2/2014 | Mahadevan et al. | |
| 2014/0306109 A1* | 10/2014 | Sun | G01N 23/2251 |
| | | | 250/307 |
| 2014/0354983 A1 | 12/2014 | Kolchin et al. | |

* cited by examiner

*Primary Examiner* — Jason McCormack
(74) *Attorney, Agent, or Firm* — Lowenstein Sandler LLP

(57) ABSTRACT

A method, computer product and system for optimization of configurable parameters of inspection tools are provided. The method includes applying a heuristic that utilizes a prioritized sequence of selections of configurable parameters. For each configuration setting of the heuristic the method includes providing a set of local scan images of a list of DOIs, calculating an optimization target function and updating the configuration settings with the best value of each scanned parameter according to said prioritization heuristic. The method includes outputting the one or more updated configuration settings to a recipe file.

20 Claims, 5 Drawing Sheets

METHOD AND SYSTEM FOR OPTIMIZING CONFIGURABLE PARAMETERS OF INSPECTION TOOLS

BACKGROUND OF THE INVENTION

It is a goal of current optical inspection tools to achieve high resolution and high throughput in order to provide the efficiency, reliability and accuracy demanded in semiconductor manufacturing process.

Inspection tools are required to detect and classify thousands of miniscule defects of interest (DOI) on the surface of an object (typically a semiconductor wafer) with high throughput and to indicate if the suspected DOIs are "killer" defects that will probably cause yield loss or nuisance that should be ignored.

Current inspection tools use dozens of configuration parameters that need to be calibrated and fine-tuned for achieving optimal inspection performance where the optimal sets of configuration parameters may depend on the inspected object and the types of DOIs per semiconductor wafer and/or photomask layer.

Accordingly, there is an unmet need to provide an automatic optimization heuristic that will enable configuring inspection tools. Furthermore, there is an unmet need to provide an automatic optimization heuristic that will enable providing a recipe that includes multiple sets of configuration parameters, fine-tuned for detection and classifications of different types of DOIs per semiconductor wafers and/or photomask layer.

SUMMARY OF THE INVENTION

The following presents a simplified summary of the invention in order to provide a basic understanding of some aspects of the invention. This summary is neither an extensive nor exhaustive overview of the invention and its various embodiments. It is intended neither to identify key or critical elements of the invention nor to delineate the scope of the invention but to present selected concepts of the invention in a simplified form as an introduction to the more detailed description presented below. As will be appreciated, other embodiments of the invention are possible utilizing, alone or in combination, one or more of the features and aspects set forth above or described in detail below.

According to an embodiment of the invention there is provided a method for optimization of configurable parameters of inspection tools, comprising: applying a heuristic that utilizes a prioritized sequence of selections of configurable parameters, said heuristic comprising: for each configuration setting: providing a set of local scan images of a list of DOIs (Defects of Interest), by said inspection tool; calculating an optimization target function using said provided local scan images; updating said configuration setting with the best value of each scanned parameter and continue said scanning over values of configurable parameters according to said heuristic; and outputting said one or more updated configuration settings to a recipe file.

The method may include receiving a list of DOIs of a specimen and receiving a base configuration setting for said inspection tool.

According to an embodiment of the invention, said applying said heuristic may comprise selecting a first configurable parameter, a second configurable parameter, a third configurable parameter and more according to said priority, selecting a plurality of values of said first configurable parameter and for each selected value scanning sequentially over values of a second, third, fourth or more configurable parameters sequentially and finding the best value of each parameter in said sequence, wherein said heuristic may include also selecting a plurality of values of said second, third, fourth or more configurable parameters and scanning sequentially over the other configurable parameters in sequence.

According to an embodiment of the invention, the applying said heuristic may comprise skipping deselected values of the higher priority configurable parameters and all configurations that include said deselected values reducing significantly the multi-dimensional space search for possible configurable parameters.

According to an embodiment of the invention, the calculating a target function may comprise calculating a signal-to-noise (SNR) function by processing said provided local scan images. The SNR function may be calculated using said local scan images comprising a cell-to-cell or a die-to-die comparisons.

According to an embodiment of the invention, the calculating a target function may comprise segmenting said provided local scan images and performing said calculation on one or more segments of said local scan images.

According to an embodiment of the invention, the selection of the a first, second, third and more configurable parameter may comprise selecting an image processing algorithm to be performed for calculating said SNR function per selected configuration.

According to an embodiment of the invention, the updating said base configuration settings with said best value may comprise finding the best value that maximizes said calculated target function.

According to an embodiment of the invention, the receiving may comprise applying a review tool for a list of DOI provided by an inspection tool using a base configuration and classifying the list of DOI into DOI types. The review tool may be selected from the group consisting of: a scanning electron microscope (SEM), a transmissive electron microscope (TEM), an STEM, an ion beam imager and an e-beam inspection tool.

The configurable parameters may include one or all of: an optical path numerical aperture (NA) parameter, a light polarization selection parameter, a spatial Fourier plane filter (CLC) parameter, a depth of field (DOF) parameter, Avalanche Photo Diode (APD) parameters, Photon Multiplier Tube (PMT) parameters, analog and digital detector gain parameters, HLI™ parameter, SN parameter and more.

According to an embodiment of the invention, the heuristic may utilize a prioritized sequence of selections of configurable parameters comprising performing an optimization scheme selected from the group consisting of: a multi-dimensional gradient ascent or descent scheme, a Monte-Carlo scheme, a machine learning scheme, a factorial design scheme and combinations thereof.

According to an embodiment of the invention there is provided a computer program product for optimizing inspection tool configurable parameters comprising a computer-readable medium having computer program logic recorded thereon arranged to put into effect the methods described herein.

According to an embodiment of the invention there is provided a system for optimization of inspection tools configurable parameters, said system comprising an inspection tool, a review tool and one or more processors configured to put into effect the methods described herein.

According to an embodiment of the invention the one or more processors may be configured to perform the following operations: applying a heuristic that utilizes a prioritized sequence of selections of configurable parameters, said heuristic comprising: for each configuration setting: providing a set of local scan images of a list of DOIs (Defects of Interest), by said inspection tool; calculating an optimization target function using said provided local scan images; updating said configuration setting with the best value of each scanned parameter and continue said scanning over values of configurable parameters according to said heuristic; and outputting said one or more updated configuration settings to a recipe file.

Numerous other aspects are provided in accordance with these and other embodiments of the invention. Other features and aspects of embodiments of the present invention will become more fully apparent from the following detailed description, the appended claims, and the accompanying drawings.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE INVENTION

Figure 1:
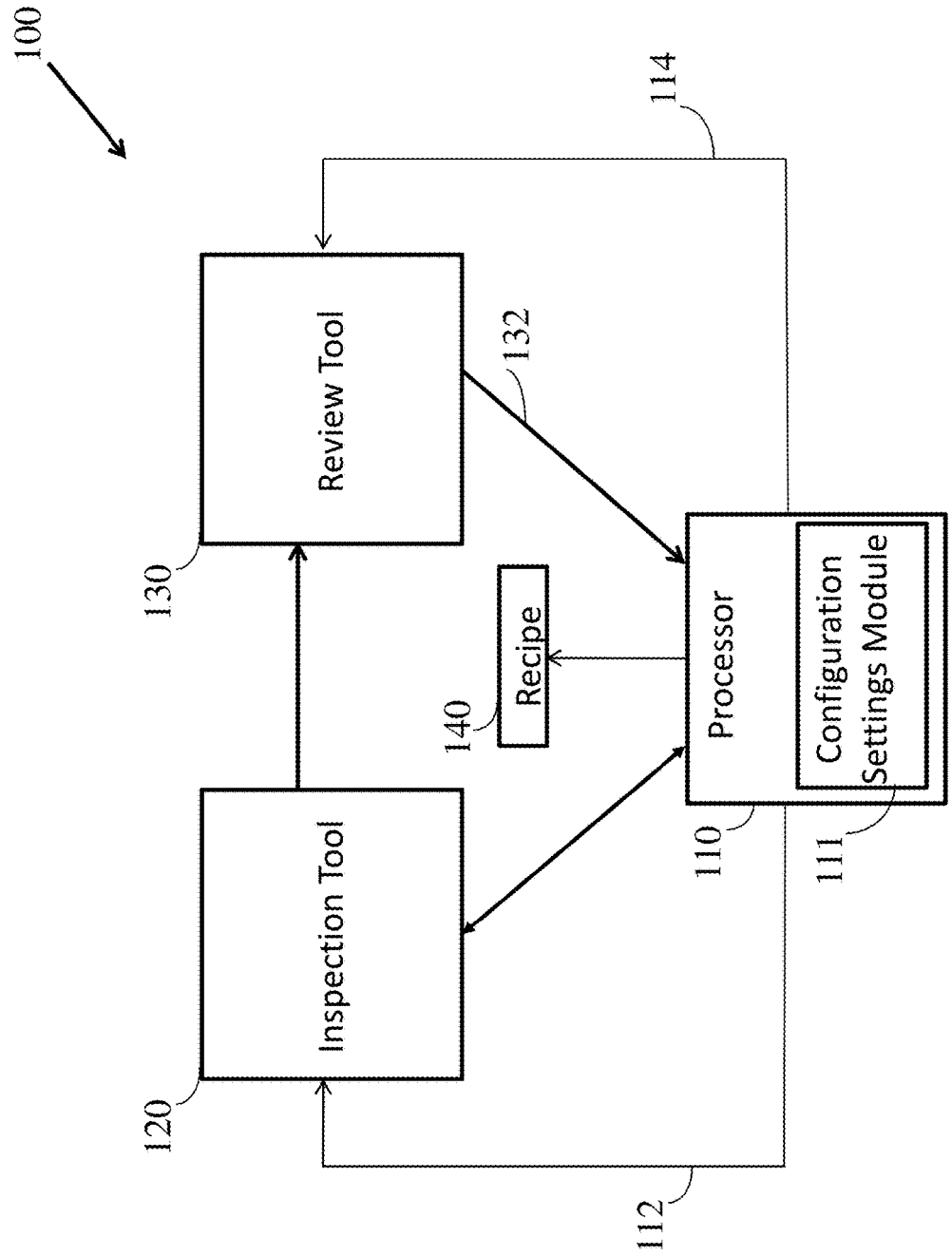
FIG. 1 illustrates a system for optimization of inspection tool's configurable parameters, according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

A group of defect candidates, defect of interest (DOI), is also referred to as a group. A portion of the group of the defect candidates is also referred to as a portion of the group. A sub-group of defect candidates is also referred to as a sub-group.

The terms "tool", "system" and "device" are used in an interchangeable manner.

The terms "computer" and "computerized device" are used in an interchangeable manner.

According to embodiments of the present invention, a heuristic prioritization method, a computer product and a system for optimization of inspection tools' configurable parameters are provided. The heuristic prioritization method includes receiving a list of DOIs of an inspected object and a base configuration settings for the inspection tool. The heuristic prioritization method includes applying a heuristic scheme that utilizes a prioritized sequence of selections of configurable parameters. For each configuration setting of the heuristic, the method includes providing a set of local scan images of one or more DOIs of the received list of DOIs, calculating an optimization target function and updating the base configuration settings with the best value of each parameter in a sequence. The heuristic prioritization method includes outputting the one or more updated configuration settings to a recipe file.

Recipe files are modular ASCII files that specify the inspection tools' configurable parameters.

According to embodiments of the present invention, applying the heuristic comprising selecting a first configurable parameter, a second configurable parameter, a third configurable parameter etc. with a built-in priority, e.g. the heuristic, selecting a plurality of values of the first configurable parameter and for each selected value scanning sequentially over values of a second, third, fourth or more configurable parameters sequentially and finding the best value of each parameter in the sequence. Optionally, the heuristic may include also selecting a plurality of values of the second, third, fourth or more configurable parameters and scanning sequentially over the other configurable parameters in sequence.

The heuristic's built-in priority may be based on the physics of the inspection process, the type of defects that needs to be detected, the illumination tool, the optical manipulation tools, the detection and processing tools, and may be adapted for each system. Hence, the invention is not limited to a specific selection of priority of configurable parameters that may change also from one inspected object to another, and other optional selections of priorities of the configurable parameters according to a heuristic are also in scope of embodiments of the invention.

The specification provides various examples of optimization schemes for inspection tools' configurable parameters that may be part of the disclosed heuristic prioritization method. It is noted that these are merely non-limiting examples and that the application is not limited by the specific examples illustrated in the specification.

It is noted that the disclosed heuristic prioritization method may be fully automatic or partially automatic. Optionally, one or more stages of the heuristic may be responsive to inputs provided by a person. The person may be a user or an operator of any of the devices and/or tools illustrated in the specification.

The person may, for example, classify defects, define defects of interest, define areas of an object that are of interest, and the like.

The following examples refer to an inspection tool and a review tool. Any review tool and any inspection tool may use one or more optical beams and/or one or more charged particle beams. Non-limiting examples of an inspection tool may include an ultraviolet (UV) inspection tool, an extreme UV inspection tool, a deep UV (DUV) inspection tool, a charged particle beam inspection tool and the like.

Non-limiting examples of a review tool may include a scanning electron microscope (SEM), a transmissive electron microscope (TEM), an STEM, an ion beam imager, and the like.

It is noted that an inspection process is typically performed by an inspection tool of a first resolution and of a first throughput while a review process is performed by a review tool of a second resolution and of a second throughput. Typically, the first resolution is lower (coarser) than the second resolution and the first throughput is higher than the second throughput.

Typically, the volume of the inspection data provided by the inspection tool thus far exceeds the volume of review data provided by the review tool. This is reflected also in the area which is covered by each one of the inspection tool and the review tool. Typically inspection provides full/high coverage of wafer area while review is limited to specific local regions around locations of interest, typically DOI.

It is noted that the inspection tool and the review tool are non-limiting examples of two evaluation tools that differ from each other by resolution and may also differ by throughput. The first tool may generate images that may be referred to as first tool images. The second tool may generate images that may be referred to as second tool images.

However, in contrast to typical inspection tool operation described above, the inventor of the present invention realized that for the optimization of inspection tools' configurable parameters, e.g. the generation of recipe files, the inspection tool may be used to provide a small set of DOIs' local scan images used to calculate a highly differentiating optimization target function. The inventor realized that an optimized recipe may be generated automatically and efficiently in a relatively short time by a heuristic described herein below using mainly the inspection tool.

Reference is now made to FIG. 1, which illustrates a system 100 for optimization of inspection tools configurable parameters, according to an embodiment of the invention. System 100 may include a processor 110, an inspection tool 120 and a review tool 130. Inspection tool 120 includes a plurality of configurable parameters and using a base configuration that may be provided by processor 110, inspection tool 120 is configured to inspect a specimen and to output a list of locations of suspected defect of interest (DOI). Review tool 130 may be configured to provide images of one or more locations of the listed DOI. Processor 110 may include a configuration setting module 111 configured to perform a heuristic prioritization method for optimization of inspection tool 120 configurable parameters described in details further below referring to FIG. 4 and FIG. 5.

Processor 110 may be configured to operate inspection tool 120 and review tool 130 and to optimize the configurable parameters of inspection tool 120 and to output a recipe 140 that may include one or more sets of configurable parameters of inspection tool 120.

The output recipe 140 may be stored in a storage connected to processor 110 or in a storage, which is a part of inspection tool 120 or review tool 130.

Configuration setting module 111 may be configured according to the heuristic prioritization method to scan sequentially over values of one configuration parameter at a time, while maintaining other configurable parameters fixed to a base configuration settings, to calculate a target optimization function and to update the base configuration settings with the best value in each scanning sequence, after each scan.

Processor 110 may be configured to communicate with inspection tool 120 and to operate and re-configure control parameters of inspection tool 112. Processor 110 may be configured to communicate with review tool 130 and to operate and/or re-configure control parameters of review tool 114. Processor 110 may be configured to operate inspection tool 120 and/or review tool 130 in iterations, where in each iteration, a set of configuration parameters may be updated. Processor 110 may be configured to output recipe 140 that may include one or more optimized sets of configuration parameters of inspection tool 120.

Optionally, the target optimization function calculated by processor 110 configuration setting module 111 may be a signal-to-noise (SNR) function calculated using the local scan images provided by inspection tool 120 per DOI type. Configuration setting module 111 may be configured to select the best value that maximizes the calculated SNR optimization function.

It should be noted that the calculated SNR function, and the selected best values that maximize the SNR function depend on local scan images (not shown in FIG. 1) provided by inspection tool 120, which depend on the configuration settings of the current iteration.

According to embodiments of the present invention, the SNR function calculation may utilize image processing techniques such as a cell-to-cell and/or a die-to-die comparisons used to increase the detection resolution.

Typically, the local scan images provided by inspection tool 120 include about 700 by 1000 pixels per image, and contain only local data specific to a suspected DOI location.

Additionally or alternatively, other target optimization functions may be defined and used by configuration setting module 111 for performing the heuristic. Accordingly, the SNR function is merely a non-limiting example of a target optimization function that may be used by embodiments of the present invention.

Optionally, configuration setting module 111 may be configured to select performing various image processing algorithms optimized to detect different types of defects increasing the detection resolution of inspection tool 120.

Figure 2:
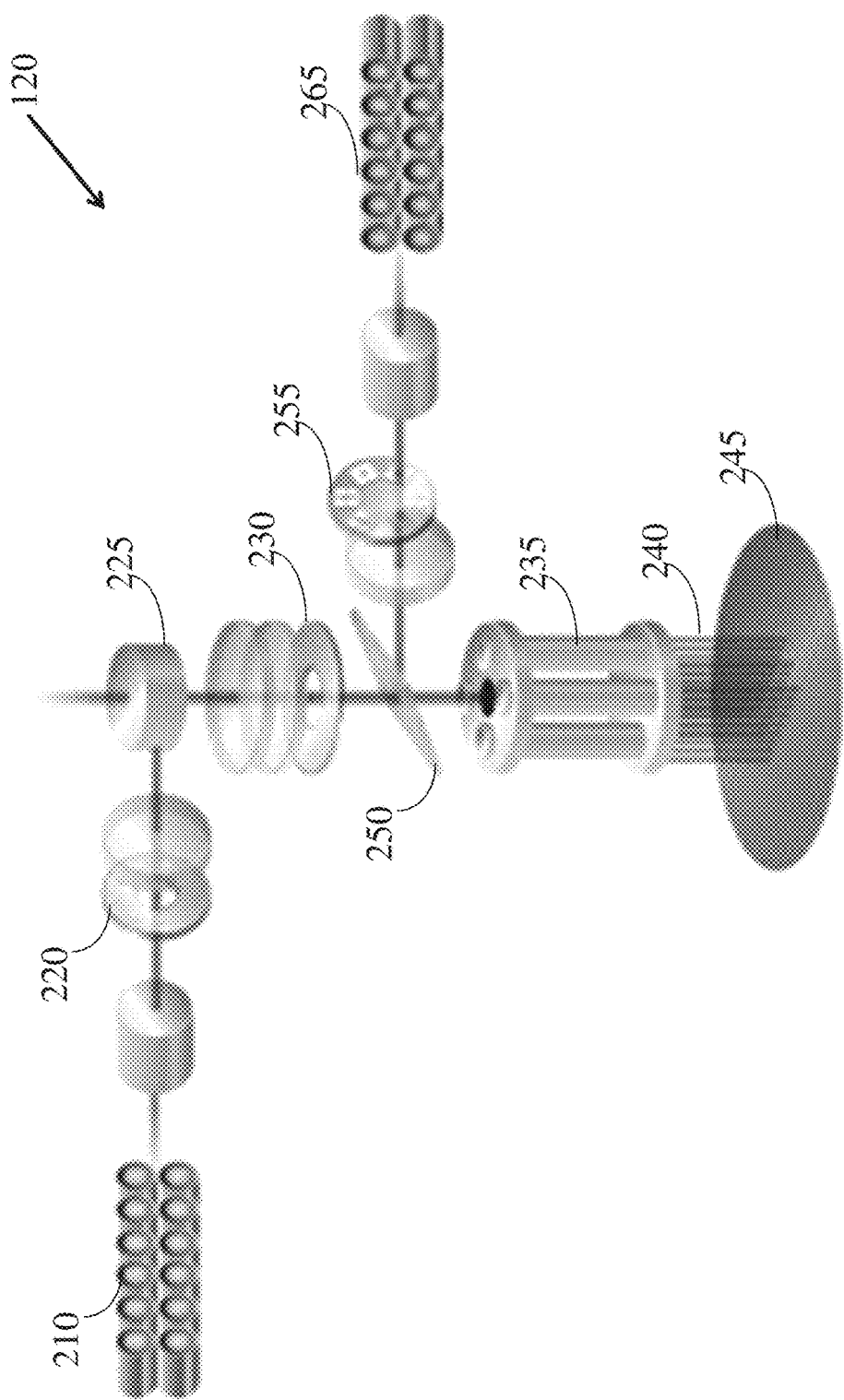
FIG. 2 illustrates an inspection tool and an object, according to an embodiment of the invention.

Reference is now made to FIG. 2, which illustrates inspection tool 120 and object 245, according to an embodiment of the invention. Inspection tool 120 may include an illumination unit (optionally a LASER, not shown in FIG. 2), a spot control unit, which is a configurable illumination path selection unit 230, a turret unit, which allows selection of the relevant telescope and as a result an optical numerical aperture (NA) 235, a beam splitter 225, a plurality of beams 240, an inspected object 245, a beam splitter mirror 250, a configurable Furrier plane filter (Customized Light Collection, CLC™) dark field (GF) perspective 255 and bright field (BF) perspective 220, a set of detectors in a GF perspective 265 and in BF perspective 210.

Object 245 may be any semiconductor product having multiple semiconductor devices thereon, at any of several stages of manufacture, or may be a mask, reticle or the like used in a manufacturing process, where specimen 245 should be inspected for defects, foreign objects or pattern accuracy.

It should be noted that it is desirable to optimize inspection tool 120 such that it identifies with high accuracy and reliability the size, location and type of structure, defect or object that appears on the inspected object 245 surface. It is highly desirable to undertake such identification at high speed with high throughput in order to minimize the delay in the manufacturing process that is provided to the inspection and quality assurance steps.

Inspection tool 120 configurable parameters may include parameters configured to optically manipulate the light beam along the illumination path (210-240) and the reflected light beam collected from the inspected specimen, object 245, along the collection path (250-265).

It should be noted that inspection tool 120 configurable parameters may include parameters that determine post-processing algorithms applied on the signal collected from inspected object 245 by the plurality of detectors 265 and hence the updated, optimized, configurable parameters affect also the post processing detection and classification performance.

For example, inspection tool 120 configurable parameters may include a focal plane filter used to optically manipulate the light at the focal Fourier plane, e.g. a CLC™ parameter 255. The significance of the CLC™ parameter is increased due to the use of a substantially single wavelength technology that results in a coherent light. Coherent light has a limited bandwidth and enables manipulating the light beam at the focal Fourier plane used to enhance desired features of the DOI and hence also the SNR and detection performance.

Inspection tool 120 configurable parameters may include a depth of field (DOF) focus parameter. DOF determines the Focus Offset (FO) when starting a wafer scan. The FO calibration is achieved by stage movement of the wafer along the Z axis. The DOF parameter is specifically significant for suspected DOI with high sensitivity to topography, for example, bottom bridges between lines might need a negative focus offset.

Inspection tool 120 configurable parameters may include an NA parameter used to determine the size of the field of view, e.g. the effective pixel size 220. It should be noted that the SNR calculation depends on NA value. Scattered and reflected light have different correlation to SNR, hence, the optimal selection of NA per DOI type for example that affects the SNR depends on both scattered and reflected light, and also incorporate the combination of the two simultaneous channels.

Figure 3B:
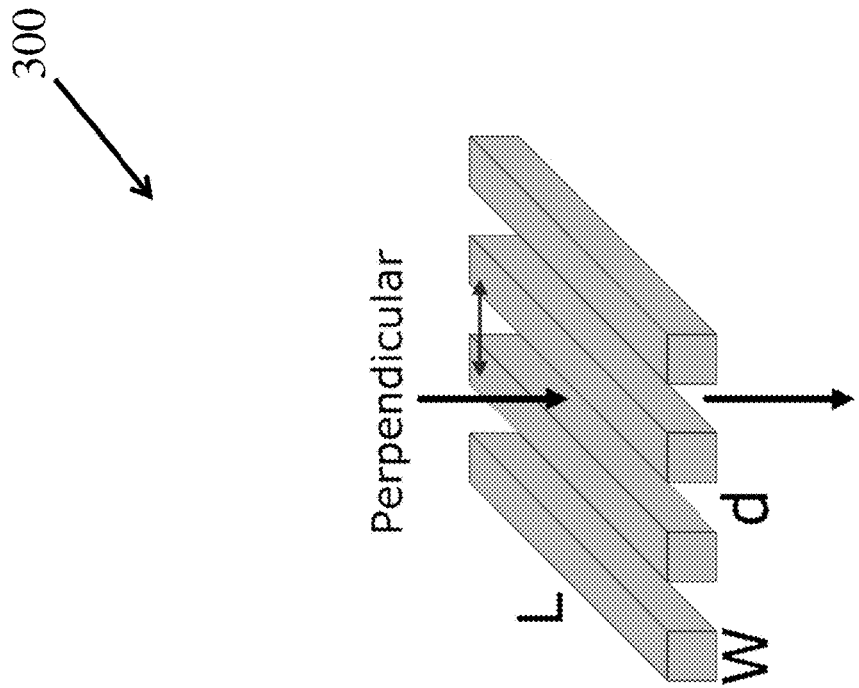
FIG. 3A and FIG. 3B illustrate parallel and perpendicular polarization configurations, according to an embodiment of the invention.
Figure 3A:
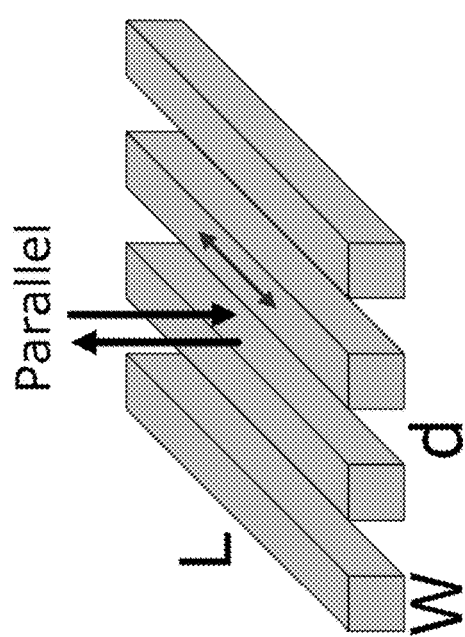

Reference is now made to FIG. 3A and FIG. 3B, which illustrate parallel and perpendicular polarization configurations, according to an embodiment of the invention. The optimal polarization configuration is determined by the physics of the photon interaction with object 245 and its suspected DOIs.

A light polarization which is parallel to the lines direction on object 245 surface illustrated in FIG. 3A enhances detection of top surface defects (such as particles), and cases of line open.

In contrast, a perpendicular light polarization shown in FIG. 3B enhances detection of bridges between lines and provides better light penetration between lines. Sub surface defects would also be best detected by a perpendicular polarization.

Inspection tool 120 configurable parameters may include a bright field (BF) mode parameters. BF imaging modes uses BF CLC™ that enhance the image contrast. Such enhancement of the contrast may be used to improve the SNR result.

Inspection tool 120 configurable parameters may include a dark filed (GF) mode parameters. GF mode parameters determine the optical manipulation along the collection path (250-265) in GF mode. GF mode parameters allow separation of the GF optimal configuration from the bright field (BF) optimal configuration.

Inspection tool 120 configurable parameters may include detector gain control parameters. Avalanche Photo Diode (APD) detectors may have certain gain considerations, while Photon Multiplier Tube (PMT) detectors may have other considerations. The detector gain parameter can be either controlled directly or by setting a target histogram to a certain score function and tuning the detector gain to converge to the desired score.

An additional configuration parameter related to the detector gain may be using a digital gain in addition to the analog gain and the weighting between the two variables.

It should be noted that detector gain tuning has a significant effect on the transition from photons as scattered/reflected from the suspected DOI to the Grey Level (GL) image which is eventually captured.

Inspection tool 120 configurable parameters may include collection polarization per each perspective (BF and GF) parameters that need to be selected for the inspection tool. It may be used to manipulate inspection tool 120 photons collection and noise suppression.

Inspection tool 120 configurable parameters may include light budget parameter, controlled through High Light Intensity (HLI™) parameter, which might have an effect on throughput. Light budget on the recipe would be determined according to the noise regime per wafer.

Shot Noise (SN) may be dominant when a finite number of particles, photons in an optical inspection tool for example, is sufficiently small so that uncertainties due to the Poisson distribution, which describes the occurrence of independent random events, are of significance.

In a SN dominant scenario, use of HLI™ may have a maximal benefit, whereas in fixed noise dominant scenario, HLI™ is less significant parameter where the SNR is less effected by the weight of the SN.

It should be noted that use of pixel size parameter in a sampling which is denser than Nyquist law would lead to additional photons scattered/reflected from the defect, which reduces the SN.

Inspection tool 120 configurable parameters may include a dozen and more parameters not listed above that need to be optimized per DOI type and inspected wafer, such as: SNR averaging, image averaging, velocity factor, Wide Dynamic Range, etc. It should be noted that the listed (and non-listed) configurable parameters need to be determined and specified in recipe 140 (illustrated in FIG. 1).

Thus, as described above, the configurable parameters defined by recipe 140 determine inspection tool 120 illumination path, collection path, characteristics of the images generated by the inspection tool, the image pre-processing and post-processing algorithms and parameters and hence each set of optimized configuration parameters defines an optical manipulation and analysis process tailored to enhance detection of specific types of defects using various optional on tool hardware and software means, where some are shown schematically in FIG. 2.

Configuration setting module 111 is configured to update a base configuration settings with the best value of each scanned parameter and continue scanning over values of configurable parameters according to the heuristic.

Additionally or alternatively, configuration setting module 111 may be configured to perform other optimization scheme, such as a multi-dimensional gradient ascent or descent scheme, a Monte-Carlo scheme, a machine learning scheme, a factorial design scheme and the like and such optimization scheme are in the scope of the present invention.

It should be noted that the heuristic prioritization method performed by processor 110 may be performed per wafer and/or photomask layer inspection. For example, at a certain inspection cycle (e.g. inspection of wafer number n) a certain DOI location may be associated with a true defect; and based on review tool results of wafer number n, while for the analysis of inspection results of wafer number n+1, the same DOI location may be associated with a nuisance, and hence the output recipe file 140 (illustrated in FIG. 1) may be specifically tailored for inspected wafers and/or mask layers.

It should be noted that in practice, a plurality of inspection tools 120 may be connected to a plurality of review tools 130 via a plurality of processors 110. For simplicity of explanation, a single processor 110 inspection tool 120 and review tool 130 are shown in FIG. 1.

For simplicity of explanation, processor 110 is shown as a stand-alone processor that may be part of a computer system (not shown in FIG. 1). It should be noted that alternatively, processor 110 may be part of inspection tool 120 or review tool 130. In any of these configurations, processor 110 may be coupled to the other system components (for example inspection tool 120 or review tool 130) directly or indirectly via a network (not shown in FIG. 1). The components accompanying processor 110 may be integrated with system 100 components.

According to an embodiment of the invention, processor 110 may be facilitated as a hardware utility which is placed on an electronic rack of, for example, inspection tool 120 or review tool 130.

According to embodiments of the invention, processor 110 may be coupled directly to a data analysis processor (not shown in FIG. 1).

According to embodiments of the invention, processor 110 may be facilitated as a software utility that is operated by the data analysis processor of either one of entities 120-130.

Processor 110 and configuration setting module 111 may be arranged to execute any one of method 400 and 500 or a combination of any operation required during any step of these methods as described further below with reference to FIGS. 4 and 5.

Processor 110 may include a storage unit (not shown) that may store at least one of (a) information required for executing one or more of methods 400 and/or 500, (b) software required for executing one or more of methods 400 and/or 500, (c) information generated during the execution of one or more of methods 400 and/or 500.

For example, the storage unit may be arranged to store a list of DOI generated by inspection tool 120, a classified lists of DOI into types generated by processor 110, images generated by inspection tool 120 and review tool 130, a base configuration parameters of inspection tool 120, updated configuration parameters of inspection tool 120, output recipe 140 and the like.

Optionally, processor 110 may be configured to classify the listed DOI generated by inspection tool 120 into a plurality of DOI types.

Figure 4:
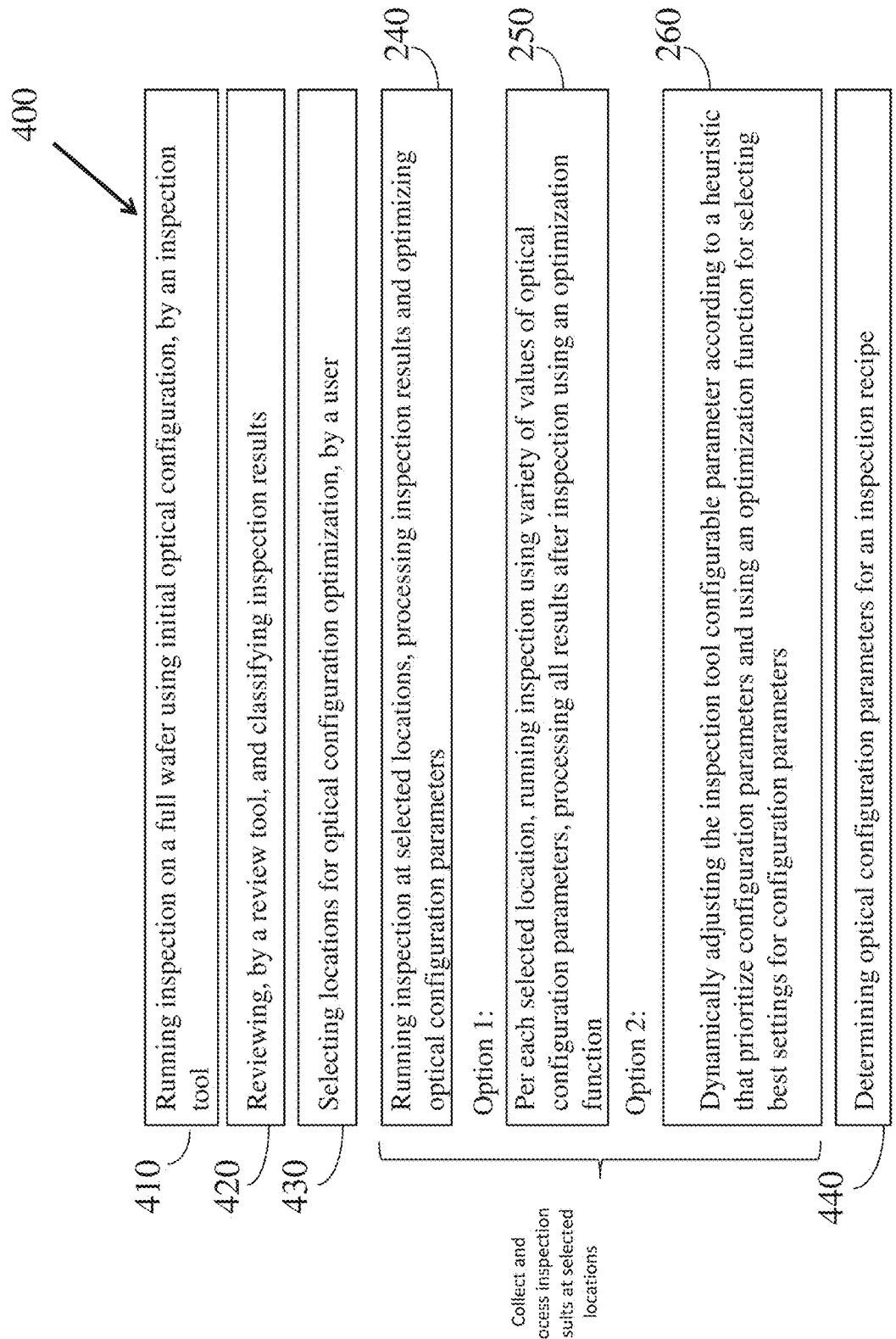
FIG. 4 illustrates an overview of a heuristic prioritization method for optimization of inspection tools configurable parameters, according to an embodiment of the invention.

Reference is now made to FIG. 4, which illustrates an overview of a heuristic prioritization method 400 for optimization of inspection tools configurable parameters, according to an embodiment of the invention. Method 400 may include in stage 410, running inspection on a full wafer using initial optical configuration, by an inspection tool; in stage 420, reviewing, by a review tool, and classifying inspection results; in stage 430, selecting locations for optical configuration optimization, by a user; in stage 440, running inspection at selected locations, processing inspection results and optimizing optical configuration parameters.

Method 400 may include in stage 450, per each selected location, running inspection using variety of values of optical configuration parameters, processing all results after inspection using an optimization function.

Alternatively, method 400 may include in stage 460, dynamically adjusting the inspection tool configuration parameters according to a heuristic that prioritize configuration parameters and using an optimization function for selecting best settings for configuration parameters.

Method 400 may include in stage 470, determining optical configuration parameters for an inspection recipe.

It should be noted that stages 410, 420 and 430 are initialization stages that may be performed manually using an inspection tool and a review tool prior to running automatically the heuristic. Optionally, stages 410, 420 and 430 may be performed automatically as part of the heuristic.

Optionally, method 400 may include in stage 410 initialization of background and preparation processes that may include pre-processing data using computer aided design (CAD) tools.

Optionally, method 400 may include in stage 410 performing a "DOI hunt", e.g. generating a list of DOI, using a base configuration set of parameters.

Optionally, method 400 may include in stage 420 processing images provided by a review tool (not shown) and classifying the DOI into types. The classification may be grouping DOI in classes of defect types and presenting a histogram of DOI types.

The classification can be performed by Automatic Defect Classification methods (ADC). Non-selected DOI can be ignored. Out of the DOI that undergo a classification process some may be classified as non-defects, some may be classified to one or more types of defects of interest and some may be classified to one or more classes that are not of interest. The DOI types of interest may be defined manually by a user, or can be defined automatically.

Figure 5:
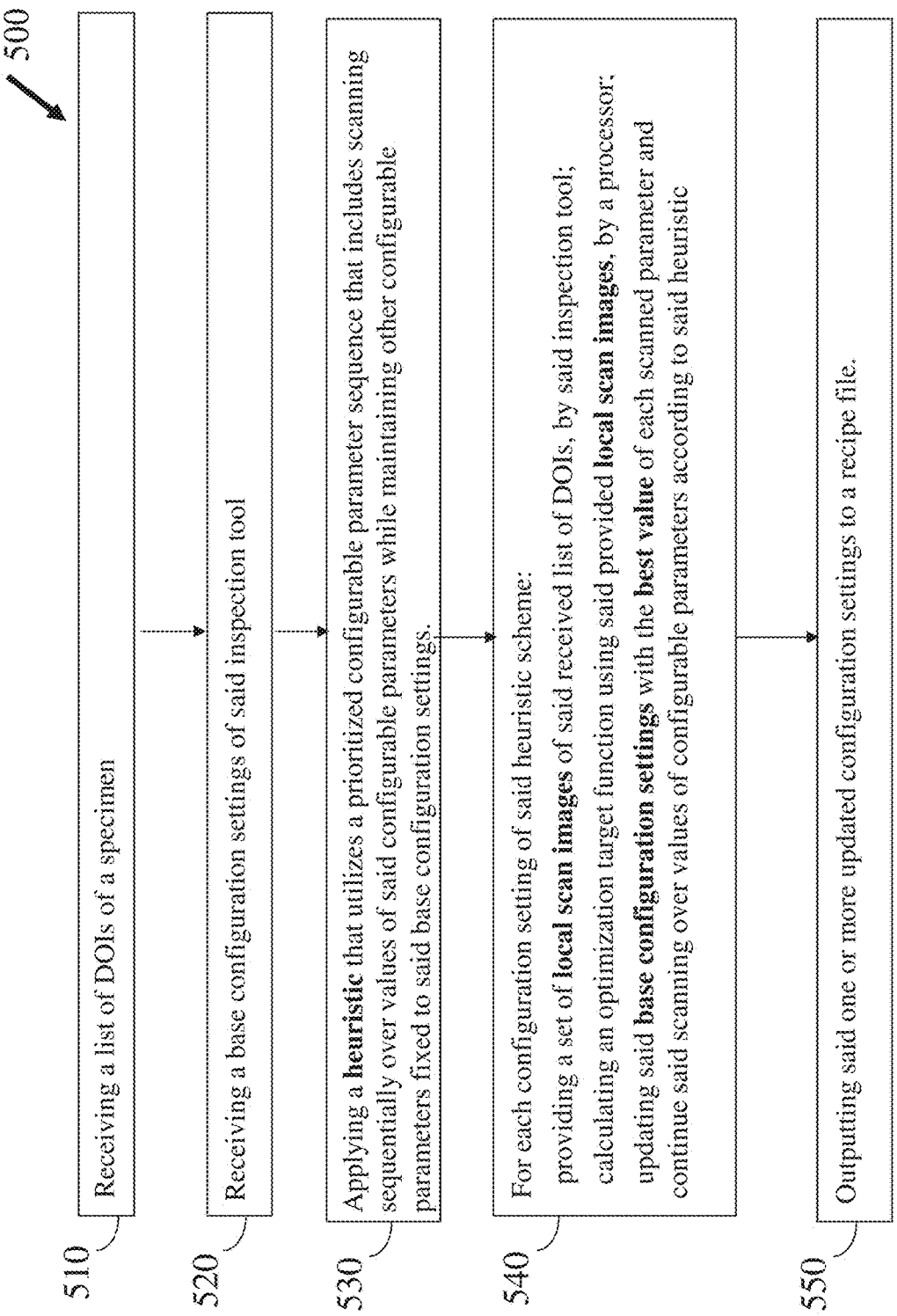
FIG. 5 illustrates a heuristic prioritization method for optimization of inspection tools configurable parameters, according to an embodiment of the invention.

Reference is now made to FIG. 5, which illustrates a heuristic prioritization method 500 for optimization of inspection tools configurable parameters, according to an embodiment of the invention. Method 500 may include in stage 510, receiving a list of DOIs of a specimen; in stage 520, receiving a base configuration settings of the inspection tool; in stage 530, applying a heuristic prioritization scheme that utilizes a prioritized sequence of selections of configurable parameters and scanning sequentially over values of the selected configurable parameters while maintaining other configurable parameters fixed to the base configuration settings; in stage 540, for each configuration settings of the heuristic: providing a set of local scan images of the received list of DOIs, by the inspection tool; calculating an optimization target function using the provided local scan images, by a processor; updating the base configuration settings with the best value of each scanned parameter and continue scanning over values of configurable parameters according to the heuristic; and in stage 550, outputting the one or more updated configuration settings to a recipe output file.

According to embodiments of the present invention, the step of applying the heuristic prioritization scheme 530 may include selecting a plurality of values of a first configurable parameter and for each selected value scanning sequentially over values of a second, third, fourth or more configurable parameters sequentially and finding the best value of each parameter in the sequence, wherein the heuristic may include also selecting a plurality of values of the second, third, fourth or more configurable parameters and scanning sequentially over the other configurable parameters.

According to embodiments of the present invention, the step of applying the heuristic prioritization scheme 530 may include skipping deselected values of the higher priority configurable parameters and all configurations that includes the deselected values reducing significantly the multi-dimensional space search of possible configurable parameters.

According to embodiments of the present invention, the step of calculating a target function 540 may include calculating a signal-to-noise (SNR) function by processing the provided local scan images.

According to embodiments of the present invention, the step of calculating SNR function using the local scan images 540 may include a cell-to-cell or a die-to-die comparisons.

According to embodiments of the present invention, the step of calculating a target function 540 may include segmenting the provided local scan images and performing the calculation on one or more segments of the local scan images.

Additionally or alternatively, an aspect ratio, estimated grade per BF or GF perspective, a difference between grades, a noise measure per perspective, an image density per perspective, an image disorder per perspective, an edginess per different degrees of measurement and per different perspective, and more estimates, may be calculated and used as optimization target function.

According to embodiments of the present invention, the step of updating the base configuration settings with the best value 540 may include finding the best value that maximizes the calculated target function.

According to embodiments of the present invention, the step of receiving 510 may include applying a review tool for a list of DOI provided by an inspection tool using a base configuration and classifying the list of DOI into DOI types.

According to embodiments of the present invention, the first, second, third, fourth or more configurable parameters may be: an optical path numerical aperture (NA) parameter (pixel size parameter), a light polarization selection parameter, a spatial Fourier plane filter (CLC) parameter, a depth of field (DOF) parameter, Avalanche Photo Diode (APD) parameter, Photon Multiplier Tube (PMT) parameters, analog and digital detector gain parameters, HLI™ parameter, SN parameter and more.

Embodiments of the invention may also be implemented in a computer program product for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program product is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program product may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

According to a further feature of an embodiment of the present invention, a computer program product for optimizing inspection tools' configurable parameters is disclosed. It should be understood that each block of the flowchart illustrations and/or block diagrams, and combinations of blocks in the flowchart illustrations and/or block diagrams, can be implemented by computer program instructions.

These computer program instructions may be provided to processor 110 (shown in FIG. 1) for implementing the functions specified in the flowcharts (shown in FIGS. 4 and 5) and block diagrams (shown in FIG. 1).

The computer program instructions may also be stored in a computer readable medium that can direct a computer or other systems to function in a particular manner, such that the instructions stored in the computer readable medium produce an article of manufacture including instructions which implement the function specified in the flowcharts and block diagrams.

The computer program product for optimizing inspection tools' configurable parameters may include first program instructions to receive a list of DOIs of a specimen and a base configuration settings of the inspection tool.

The computer program product may include second program instructions to apply a heuristic prioritization scheme that utilizes a prioritized sequence of selections of configurable parameters.

The computer program product may include third program instructions, for each configuration setting of the heuristic prioritization scheme, to provide a set of local scan images of the received list of DOIs, by the inspection tool, to calculate an optimization target function using the provided local scan images, and to update the base configuration settings with the best value of each scanned parameter and continue the scanning over values of configurable parameters according to the heuristic.

The computer program product may include fourth program instructions to output the one or more updated configuration settings to a recipe file.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

While a number of exemplary aspects and embodiments have been discussed above, those of skill in the art will recognize certain modifications, permutations, additions and sub combinations thereof. It is therefore intended that the following appended claims and claims hereafter introduced be interpreted to include all such modifications, permutations, additions and sub-combinations as are within their true spirit and scope.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description. While preferred embodiments of the present invention have been shown and described, it should be understood that various alternatives, substitutions, and equivalents can be used, and the present invention should only be limited by the claims and equivalents thereof.

What is claimed is:

1. A method for optimization of configurable parameters of an inspection tool, comprising:
   determining defects of interest (DOIs) of a specimen;
   receiving a base configuration comprising a plurality of settings for the configurable parameters of the inspection tool;
   applying a heuristic to the base configuration, the heuristic utilizing a prioritized sequence of selections of the plurality of settings for the configurable parameters, said heuristic comprising:
   for each setting in the base configuration:

receiving a set of images of the DOIs;
calculating an optimization target function using said set of images;
selecting a plurality of values for a respective configurable parameter of the configurable parameters;
for each selected value, scanning, by a processor, sequentially over other configurable parameters of the configurable parameters to determine an optimal value for each of the configurable parameters to maximize a ratio pertaining to the optimization target function;
updating said setting of the base configuration with the optimal values for the configurable parameters; and
outputting said one or more updated settings to a recipe file.

2. The method according to claim 1, wherein determining the DOIs comprises:
receiving a list of the DOIs of the specimen.

3. The method according to claim 1, wherein applying said heuristic comprises:
deselecting one or more values of higher priority configurable parameters; and
skipping the deselected one or more values of the higher priority configurable parameters.

4. The method according to claim 1, wherein said calculating the optimization target function comprises:
calculating a signal-to-noise (SNR) function by processing said images.

5. The method according to claim 4, wherein said calculating the SNR function using said images comprises a cell-to-cell or a die-to-die comparison.

6. The method according to claim 1, wherein said calculating the optimization target function comprises:
segmenting said images; and
performing said calculating on one or more segments of said images.

7. The method according to claim 4, further comprising:
selecting an image processing algorithm to be performed for calculating said SNR function.

8. The method according to claim 1, wherein said determining DOIs comprises:
sending a request to a review tool for a list of DOIs, wherein the list of DOIs is classified into DOI types.

9. The method according to claim 8, wherein said review tool is selected from a group consisting of: a scanning electron microscope (SEM), a transmissive electron microscope (TEM), an STEM, an ion beam imager and an e-beam inspection tool.

10. The method according to claim 1, wherein said configurable parameters: comprise at least one of an optical path numerical aperture (NA) parameter, a light polarization selection parameter, a spatial Fourier plane filter (CLC) parameter, a depth of field (DOF) parameter, Avalanche Photo Diode (APD) parameters, Photon Multiplier Tube (PMT) parameters, analog and digital detector gain parameters, an HLI™ parameter, or a shot noise (SN) parameter.

11. The method according to claim 1, wherein applying said heuristic further comprises:
performing one or more optimization schemes selected from a group consisting of: a multi-dimensional gradient ascent or descent scheme, a Monte-Carlo scheme, a machine learning scheme, and a factorial design scheme.

12. A computer program product for optimizing inspection tool configurable parameters comprising a computer-readable medium having computer program logic recorded thereon arranged to cause a processor to perform operations comprising:
determining defects of interest (DOIs) of a specimen;
receiving a base configuration comprising a plurality of settings for the configurable parameters of the inspection tool;
applying a heuristic to the base configuration, the heuristic utilizing a prioritized sequence of selections of the plurality of settings for the configurable parameters, said heuristic comprising:
for each setting in the base configuration:
receiving a set of images of the DOIs;
calculating an optimization target function using said set of images;
selecting a plurality of values for a respective configurable parameter of the configurable parameters;
for each selected value, scanning, by the processor, sequentially over other configurable parameters of the configurable parameters to determine an optimal value for each of the configurable parameters to maximize a ratio pertaining to the optimization target function;
updating said setting of the base configuration with the optimal values for the configurable parameters; and
outputting said one or more updated settings to a recipe file.

13. A system for optimization of inspection tools configurable parameters, said system comprising:
an inspection tool;
a review tool; and
a processor configured to:
determine defects of interest (DOIs) of a specimen;
receive a base configuration comprising a plurality of settings for the configurable parameters of the inspection tool;
apply a heuristic to the base configuration, the heuristic utilizing a prioritized sequence of selections of the plurality of settings for the configurable parameters, said heuristic comprising:
for each setting in the base configuration:
receive a set of images of the DOIs;
calculate an optimization target function using said set of images;
select a plurality of values for a respective configurable parameter of the configurable parameters;
for each selected value, scan sequentially over other configurable parameters of the configurable parameters to determine an optimal value for each of the configurable parameters to maximize a ratio pertaining to the optimization target function;
update said setting of the base configuration with the optimal values for the configurable parameters; and
output said one or more updated settings to a recipe file.

14. The system according to claim 13, wherein to apply said heuristic, the processor is to:
deselect one or more values of higher priority configurable parameters; and
skip the deselected one or more values of the higher priority configurable parameters.

15. The system according to claim 13, wherein to calculate the optimization target function, the processor is to:

calculate a signal-to-noise (SNR) function by processing said images.

16. The system according to claim 15, wherein to calculate the SNR function using said images comprises a cell-to-cell or a die-to-die comparison.

17. The system according to claim 15, wherein the processor is further to:
   select an image processing algorithm to be performed for calculating said SNR function.

18. The computer-readable medium of claim 12, wherein applying said heuristic comprises:
   deselecting one or more values of higher priority configurable parameters; and
   skipping the deselected one or more values of the higher priority configurable parameters.

19. The computer-readable medium of claim 12, wherein said calculating the optimization target function comprises:
   calculating a signal-to-noise (SNR) function by processing said images using a cell-to-cell or a die-to-die comparison.

20. The computer-readable medium of claim 19, further comprising:
   selecting an image processing algorithm to be performed for calculating said SNR function.

* * * * *